(12) United States Patent
Rofougaran et al.

(10) Patent No.: US 8,244,189 B2
(45) Date of Patent: Aug. 14, 2012

(54) METHOD AND SYSTEM FOR CHIP-TO-CHIP MESH NETWORKS

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

(*) Notice: Subject to any disclaimer, the term of this patent is extended or adjusted under 35 U.S.C. 154(b) by 343 days.

(21) Appl. No.: 12/469,231

(22) Filed: May 20, 2009

(65) Prior Publication Data

US 2010/0297954 A1    Nov. 25, 2010

(51) Int. Cl.
*H04B 1/40* (2006.01)

(52) U.S. Cl. ...... 455/75; 455/88; 455/562.1; 455/575.7; 455/129; 375/146; 375/150; 343/793

(58) Field of Classification Search .................. 455/75, 455/73, 88, 91, 562.1, 575.7, 575.5, 276.1, 455/121, 129, 11.1, 90.3, 425; 375/146, 375/147, 105, 267; 343/793
See application file for complete search history.

(56) References Cited

U.S. PATENT DOCUMENTS

| | | | | |
|---|---|---|---|---|
| 6,046,703 A | * | 4/2000 | Wang et al. | 343/795 |
| 2002/0119808 A1 | * | 8/2002 | Seiki | 455/575 |
| 2003/0109285 A1 | * | 6/2003 | Reed et al. | 455/562 |
| 2007/0020445 A1 | * | 1/2007 | Liu et al. | 428/195.1 |
| 2007/0121947 A1 | * | 5/2007 | Sood et al. | 380/277 |

* cited by examiner

*Primary Examiner* — Shaima Q Aminzay
(74) *Attorney, Agent, or Firm* — Farjami & Farjami LLP

(57) ABSTRACT

A wireless device comprising a plurality of chips may be operable to communicate wireless signals via a mesh network comprising a plurality of integrated directional antennas on the plurality of chips. Wireless signals may be communicated between the plurality of the chips and/or with devices external to the wireless device via the mesh network. Beam-formed wireless signals may be communicated via the plurality of integrated directional antennas. The plurality of chips may be integrated on a single package or on a plurality of packages, which may comprise one or more circuit boards. Wireless signals may be communicated with devices external to the single package via the mesh network. The directional antennas may comprise patch antennas and/or dipole antennas.

16 Claims, 7 Drawing Sheets

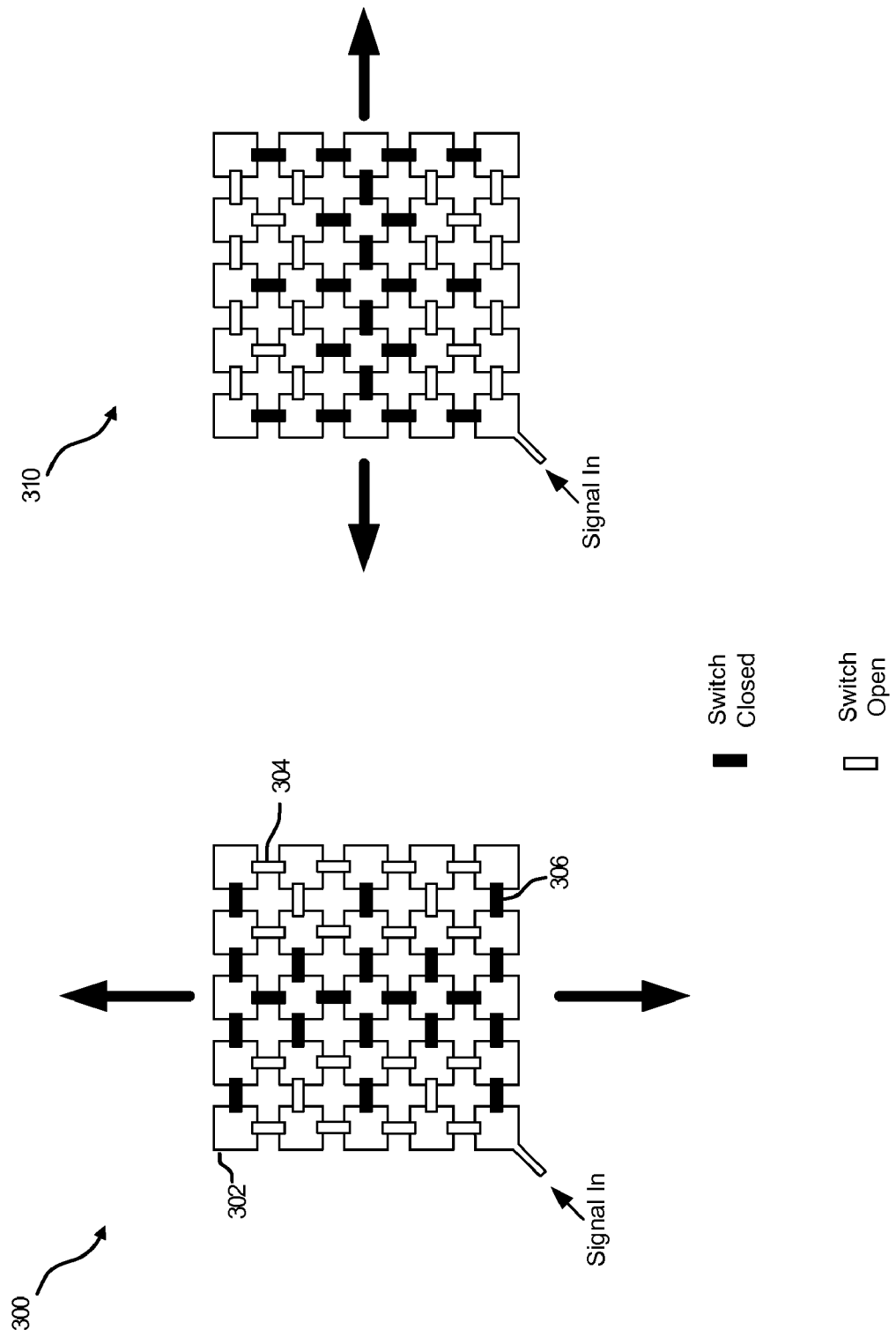

_METHOD AND SYSTEM FOR CHIP-TO-CHIP MESH NETWORKS_

CROSS-REFERENCE TO RELATED APPLICATIONS/INCORPORATION BY REFERENCE

This application makes reference to:
U.S. patent application Ser. No. 12/463,726 filed on May 11, 2009; and U.S. patent application Ser. No. 12/469,247 filed on May 20, 2009.

Each of the above stated applications is hereby incorporated herein by reference in its entirety.

FIELD OF THE INVENTION

Certain embodiments of the invention relate to wireless communication. More specifically, certain embodiments of the invention relate to a method and system for chip to chip mesh networks.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for chip to chip mesh networks, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 3B is a diagram illustrating exemplary directional patch antennas, in accordance with an embodiment of the invention.

DETAILED DESCRIPTION OF THE INVENTION

Certain aspects of the invention may be found in a method and system for chip to chip mesh networks. In various exemplary aspects of the invention, wireless signals may be communicated via a mesh network comprising a plurality of integrated directional antennas on a plurality of chips in a wireless device. The mesh network may be established by one or more transmitters and/or receivers integrated within each of the plurality of chips, and which are communicatively coupled to the plurality of integrated directional antennas. The wireless signals may be communicated between the plurality of the chips and/or with devices external to the wireless device via the mesh network. Beam-formed wireless signals may be communicated via the plurality of integrated directional antennas. The plurality of chips may be integrated on a single package or on a plurality of packages, which may comprise one or more circuit boards. Wireless signals may be communicated with devices external to the single package via the mesh network. The directional antennas may comprise patch antennas and/or dipole antennas.

Figure 1:
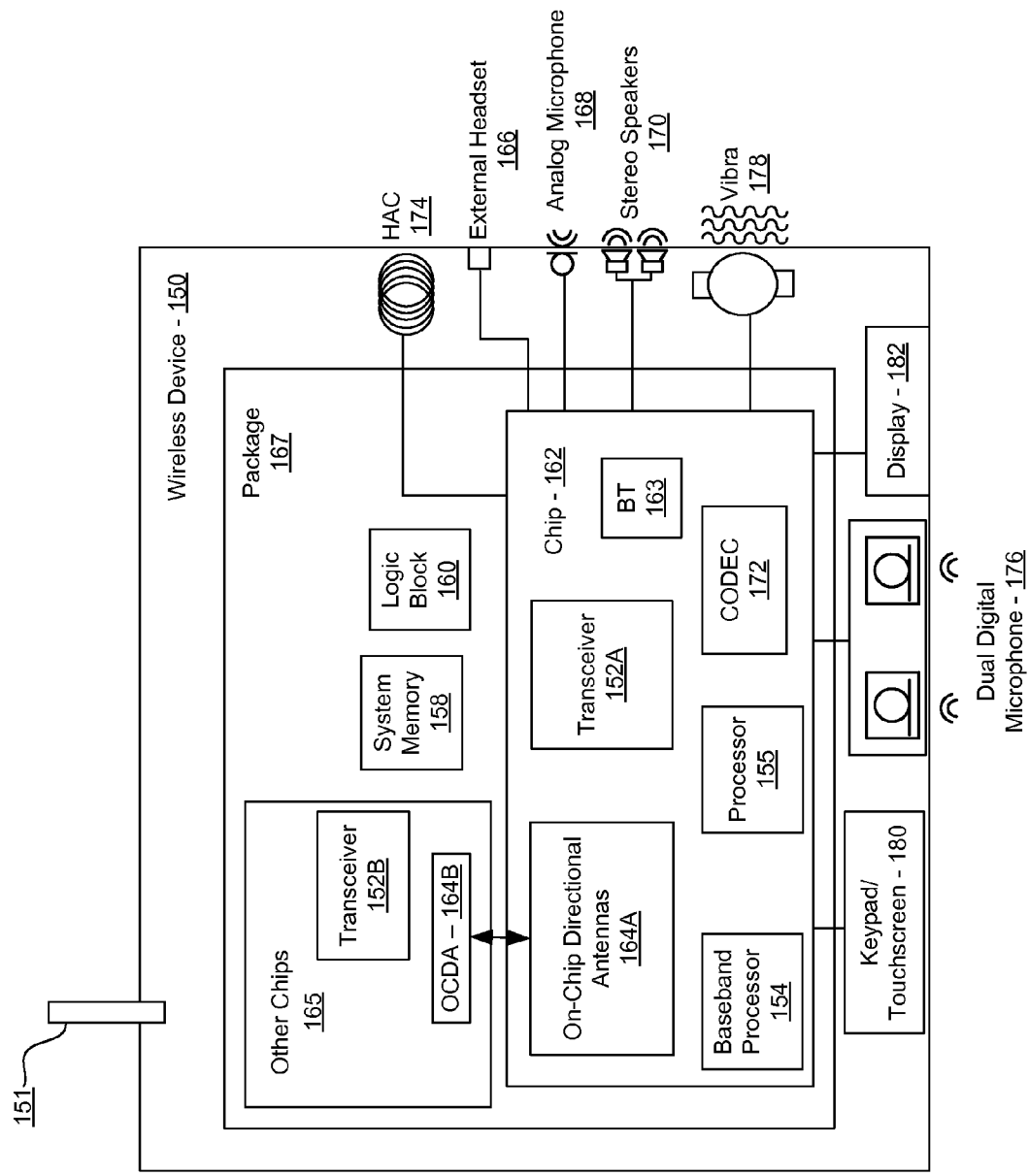
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless device 150 may comprise an antenna 151, a chip 162, other chips 165, transceivers 152A and 152B integrated on the chip 162 and the other chips 165, respectively, a baseband processor 154, a processor 156, a system memory 158, a logic block 160, on-chip directional antennas 164A and 164B, an external headset port 166, and a package 167. The wireless device 150 may also comprise an analog microphone 168, integrated hands-free (IHF) stereo speakers 170, a hearing aid compatible (HAC) coil 174, a dual digital microphone 176, a vibration transducer 178, a keypad and/or touchscreen 180, and a display 182.

The transceivers 152A and 152B may comprise suitable logic, circuitry, interfaces, and/or code that may be enabled to modulate and upconvert baseband signals to RF signals for transmission by one or more antennas, which may be represented generically by the antenna 151 and the on-chip directional antennas 164A and 164B. The transceivers 152A and 152B may also be enabled to downconvert and demodulate received RF signals to baseband signals. The RF signals may be received by one or more antennas, which may be represented generically by the antenna 151. Different wireless systems may use different antennas for transmission and reception. The transceivers 152A and 152B may be enabled to execute other functions, for example, filtering the baseband and/or RF signals, and/or amplifying the baseband and/or RF signals. Although a single transceiver on each chip is shown, the invention is not so limited. Accordingly, the transceivers 152A and 152B may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, LTE, 3GPP, UMTS, UWB, BLUETOOTH, and ZIGBEE, for example.

The baseband processor 154 may comprise suitable logic, circuitry, interfaces, and/or code that may be enabled to process baseband signals for transmission via the transceivers 152A and 152B and/or the baseband signals received from the transceivers 152A and 152B. The processor 156 may be any suitable processor or controller such as a CPU, DSP, ARM, or any type of integrated circuit processor. The processor 156 may comprise suitable logic, circuitry, and/or code that may be enabled to control the operations of the transceivers 152A and 152B and/or the baseband processor 154. For example, the processor 156 may be utilized to update and/or modify programmable parameters and/or values in a plurality of components, devices, and/or processing elements in the transceivers 152A and 152B and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceivers 152A and 152B. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceivers 152A and 152B from the system memory 158 via the processor 156.

The system memory 158 may comprise suitable logic, circuitry, interfaces, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interfaces, and/or code that may enable controlling of various functionalities of the wireless device 150. For example, the logic block 160 may comprise one or more state machines that may generate signals to control the transceivers 152A and 152B and/or the baseband processor 154. The logic block 160 may also comprise registers that may hold data for controlling, for example, the transceivers 152A and 152B and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interfaces, and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interfaces, and/or code that may be operable to process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, I²S FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The CODEC 172 may utilize a programmable infinite impulse response (IIR) filter and/or a programmable finite impulse response (FIR) filter for at least a portion of the audio sources to compensate for passband amplitude and phase fluctuation for different output devices. In this regard, filter coefficients may be configured or programmed dynamically based on current operations. Moreover, the filter coefficients may be switched in one-shot or may be switched sequentially, for example. The CODEC 172 may also utilize a modulator, such as a Delta-Sigma (Δ-Σ) modulator, for example, to code digital output signals for analog processing.

The chip 162 may comprise an integrated circuit with multiple functional blocks integrated within, such as the transceiver 152A, the processor 156, the baseband processor 154, the BT radio/processor 163, the on-chip directional antennas 164A, and the CODEC 172. The number of functional blocks integrated in the chip 162 is not limited to the number shown in FIG. 1. Accordingly, any number of blocks may be integrated on the chip 162 depending on chip space and wireless device 150 requirements, for example.

The other chips 165 may comprise one or more integrated circuits comprising multiple functional blocks integrated within, such as the transceiver 152B and the on-chip directional antenna 164B. In another embodiment of the invention, portions of the circuitry in the wireless device 150 may be integrated on the other chips 165, such as the CODEC 172, the processor 155, the baseband processor 154, and/or the BT radio/processor 163.

The on-chip directional antennas 164A and 164B may comprise metallic layers deposited on and/or integrated in the chip 162 and/or the other chips 165 and may be operable to emit and/or receive electromagnetic radiation in and/or from a desired direction, depending on the geometry of the particular antenna being activated. In addition, the on-chip directional antennas 164A may comprise patch antennas that may be operable to emit and/or receive EM signals at configurable frequencies. In this manner, antennas on various chips in the wireless device 150 may communicate at different wavelengths depending on which chips need to communicate at a particular time.

The external headset port 166 may comprise a physical connection for an external headset to be communicatively coupled to the wireless device 150. The analog microphone 168 may comprise suitable circuitry, logic, and/or code that may detect sound waves and convert them to electrical signals via a piezoelectric effect, for example. The electrical signals generated by the analog microphone 168 may comprise analog signals that may require analog to digital conversion before processing.

The package 167 may comprise a printed circuit board or other support structure for the chip 162, the other chips 165, and other components of the wireless device 150. The package 167 may comprise an insulating material, for example, and may provide isolation between electrical components mounted on the package 167. In another embodiment of the invention, the chip 162 and the other chips 165 may be integrated on a plurality of packages. A directional antenna's position on a chip, as well as the chip's location on a package, may make the antenna the optimum antenna for transmission of signals in a particular direction with one or more external devices, or with devices on other boards, for example.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 155 may utilize the received control and/or data information, which may comprise the programmable parameters, to determine an operating mode of the transceivers 152A and 152B. For example, the processor 155 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 155, for example. The information stored in system memory 158 may be transferred to the transceivers 152A and 152B from the system memory 158 via the processor 155.

The CODEC 172 in the wireless device 150 may communicate with the processor 155 in order to transfer audio data and control signals. Control registers for the CODEC 172 may reside within the processor 155. The processor 155 may exchange audio signals and control information via the system memory 158. The CODEC 172 may up-convert and/or down-convert the frequencies of multiple audio sources for processing at a desired sampling rate.

The signals processed by the processor 155 and/or the baseband processor 154 may be communicated to and/or from devices in circuitry within the chip 162 and the other chips 165. Directional antennas, such as the on-chip directional antennas 164A and 164B may be utilized to direct signals at appropriate chips intended to receive particular signals. By utilizing wireless signals as opposed to wire traces between chips, which may comprise significant stray impedances that reduce the maximum data transfer rate, higher signal communication bandwidth may be achieved utilizing lower power. In addition the directional antennas may be operable to communicate wireless signals to external devices, such as devices on other packages or boards in the wireless device 150, or with devices external to the wireless device 150.

Figure 2A:
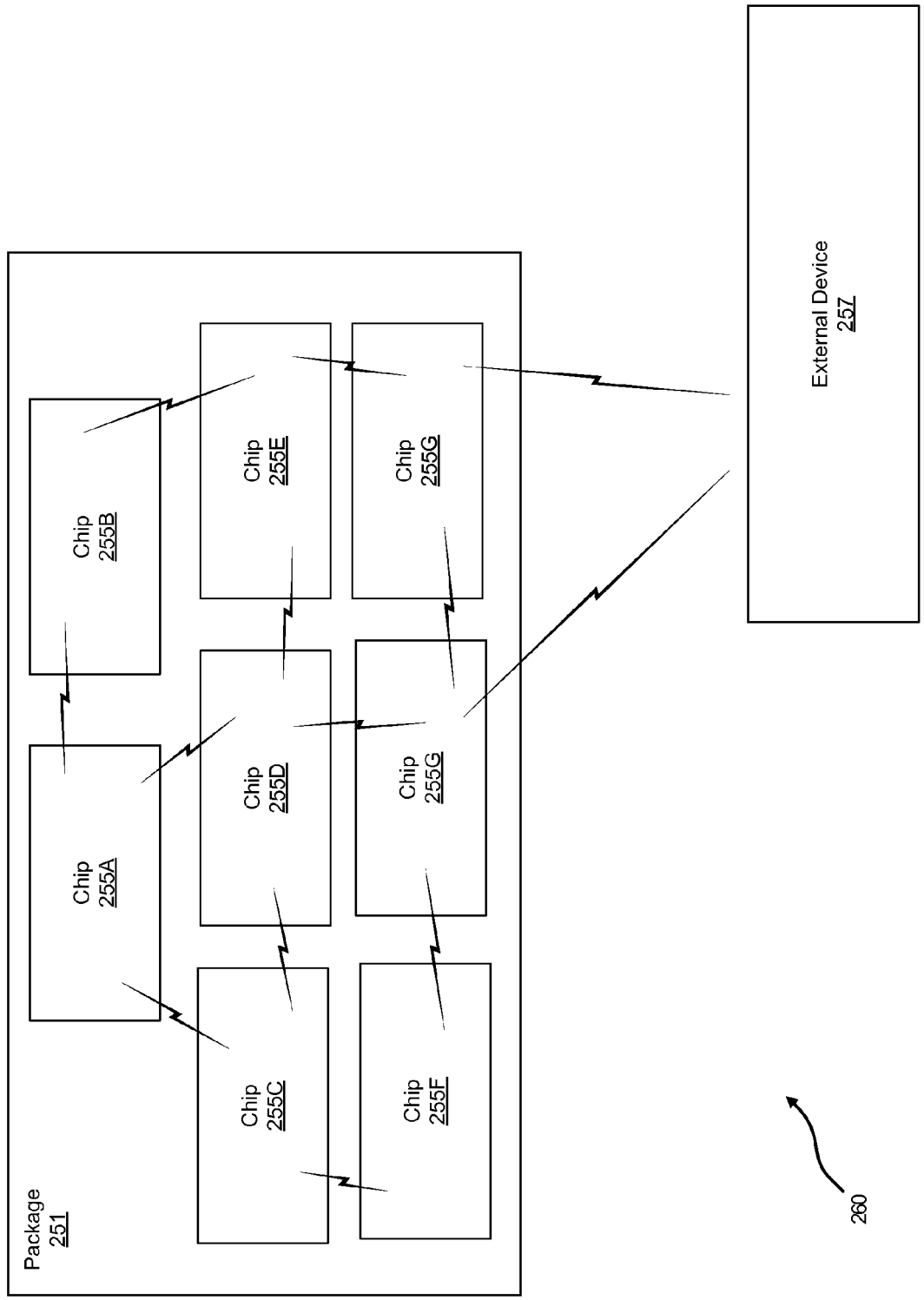
FIG. 2A is a block diagram illustrating exemplary chip to chip mesh network to external device communication, in accordance with an embodiment of the invention.

FIG. 2A is a block diagram illustrating exemplary chip to chip mesh network to external device communication, in accordance with an embodiment of the invention. Referring to FIG. 2A, there is shown a mesh network 260 and a package 251 comprising a plurality of chips 255A-255G. There is also shown an external device 257. The chips 255A-255G may be substantially similar to the chip 162 and the other chips 165, described with respect to FIG. 1, and may comprise on-chip directional antennas and transceivers.

The plurality of chips 255A-255G may be operable to create a mesh network where each chip may be a node in the network and may be utilized to communicate between the chips 255A-255G as well as to external devices, such as the external device 257. In instances where the chips 255A-255G may be communicating with an external device, the optimum communication configuration may be determined by which chip, or combination of chips, receives the maximum signal from the external device 257. In addition, with a plurality of directional antennas, beam forming may be utilized to direct a transmitted signal at the external device 257.

In operation, the chips 255A-255G may be configured for inter-chip communication. In this manner, signals may be communicated between chips without utilizing wire traces between chips on the package 251. In addition, a mesh network may be established by the wireless communications capability of a plurality of the chips 255A-255G for efficient communication of signals between chips on the package 251, with devices external to the package 251 but within the wireless device 150, and/or with devices external to the wireless device 150, such as the wireless device 257. Beamforming may be utilized for optimum communication between the chips 255A-255G and/or with external devices such as the external device 257. The signals may be communicated between the chips 255A-255G via on-chip directional antennas, such as the on-chip directional antennas 164A and 164B described with respect to FIG. 1.

In an embodiment of the invention, the optimum configuration for a communications link via the mesh network comprising the chips 255A-255G and a particular device may be determined by a processor, such as the processor 155 and/or the baseband process 154, for example, described with respect to FIG. 1. A maximum received signal for various on-chip directional antenna configurations may indicate the optimum configuration, which may then be utilized for wireless communication with external devices. The optimum configuration may be dynamically adjusted for maximum received signals on a periodic basis, for example. The configuration may be different for inter-chip communication compared to communication with an external device, for example.

The chips 255A-255G comprising the mesh network 260 may also comprise suitable logic, circuitry, interfaces, and/or code that may enable forming mesh-like, ad hoc wireless networks of chips.

In operation, the plurality of chips 255A-255G may communicate with each other if the devices are within device-to-device operational proximity. Formation of device-to-devices connections between devices in the plurality of chips 255A-255G may enable formation of the mesh network 260.

Once the mesh network 260 is formed, the chips 255A-255G may attempt to exchange data and/or messages. The data exchange may be utilized to perform communication between chips 255A-255G and the mesh network 260, or alternatively, the data exchange may be utilized to facilitate communication between a chip of the chips 255A-255G in the mesh network 260 and some external entity; for example the external device 257. Performing data exchange in the mesh network 260 may require data queuing in some of the chips 255A-255G in the mesh network 260. For example, the chip 255A may determine that the chip 255G may be the most likely candidate to forward data from the chip 255D to the external device 257. The chip 255G may be unable to forward data received from the chip 255D due to loss of connectivity with the external device 257. The chip 255A may queue the data received from the chip 255D until connectivity with the external device 257 may be re-established. Determination of availability of queuing and/or size of data that may be queued may comprise utilizing a queuing sub-system in the processor 155, for example, described with respect to FIG. 1.

Furthermore, the mesh network 260 may utilize an internal addressing scheme wherein each chip in the mesh network 260 may be assigned a unique internal address. For example, the plurality of chips 255A-255G may be assigned unique internal address identities. A chip in the mesh network 260 may become communicatively coupled to an external network. For example, the chip 255A may become communicatively coupled to a WiFi network. The chip 255A may be assigned an address consistent with the external network. However, the chip 255A may also retain its internal address identity to enable remaining chips in the mesh network 260 to continue communicating with the chip 255A for data exchange and/or data queuing purposes.

In an embodiment of the invention, a chip joining the mesh network 260 may determine its queuing availability utilizing a queuing sub-system. Furthermore, the queuing availability may continually and/or dynamically be updated as queuing-related resources may change. For example, power resources may be relevant when determining data queuing and/or size of data that may be queued. Therefore, changes in the power resources may cause changes in queuing availability in a chip in the mesh network 260.

Figure 2B:
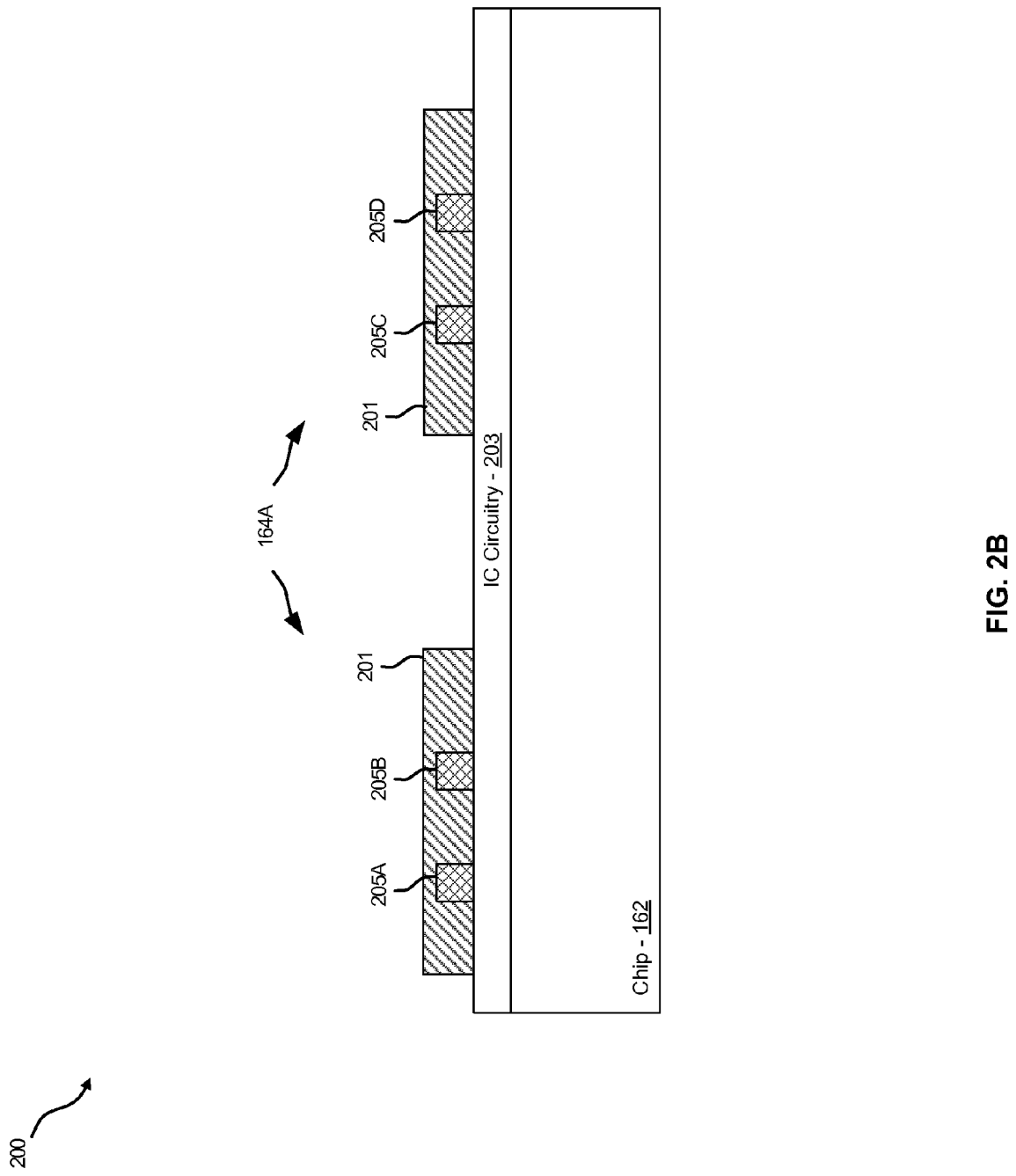
FIG. 2B is a block diagram illustrating exemplary on-chip directional antennas, in accordance with an embodiment of the invention.

FIG. 2B is a block diagram illustrating exemplary on-chip directional antennas, in accordance with an embodiment of the invention. Referring to FIG. 2B, there is shown the on-chip directional antennas 164A integrated on the chip 162 comprising IC circuitry 203. The IC circuitry 203 may comprise various circuitry in the wireless device, as described with respect to FIG. 1.

The on-chip directional antennas 164A may comprise one or more conductive layers 201 deposited on and/or integrated in the chip 162 with the IC circuitry 203 and a plurality of antenna ports 205A-205D. The antenna ports 205A-205D may comprise conductive material and may enable electrical connectivity to the on-chip directional antennas 164A from other circuitry in the IC circuitry 203, such as the transceivers 152A and 152B, for example. In this manner, circuitry within the chip 162 may communicate with circuitry within other chips or external devices via the on-chip directional antennas 164A. The invention is not limited to the number of on-chip directional antennas 164A shown in FIG. 2B. Accordingly, any number of on-chip directional antennas may be integrated depending on space requirements, and the number of directions communications may be desired. For example, on-chip directional antennas may be integrated at each edge of the chip 162 to enable communication with chips and/or external devices in each direction.

In operation, signals may be communicated between chips in the wireless device 150 via the on-chip directional antennas 164A, and on-chip directional antennas on other chips, such as the on-chip directional antennas 164B. For example, the antenna ports 205A-205D may enable the communication of signals to and/or from the on-chip directional antennas 164A. The signals may be directed at intended chips within the wireless device 150 utilizing beam forming by enabling antennas with a specific geometry for transmitting signals in a particular direction, as described further with respect to FIG. 3A-4.

In another embodiment of the invention, the on-chip directional antennas 164A may be utilized with similar on-chip directional antennas on other chips to create a mesh network that may be operable to communicate signals between the chips, as well as to external devices. Optimum directional antenna configurations may be dynamically adjusted based on the direction of the receiving chip and/or device.

Figure 3A:
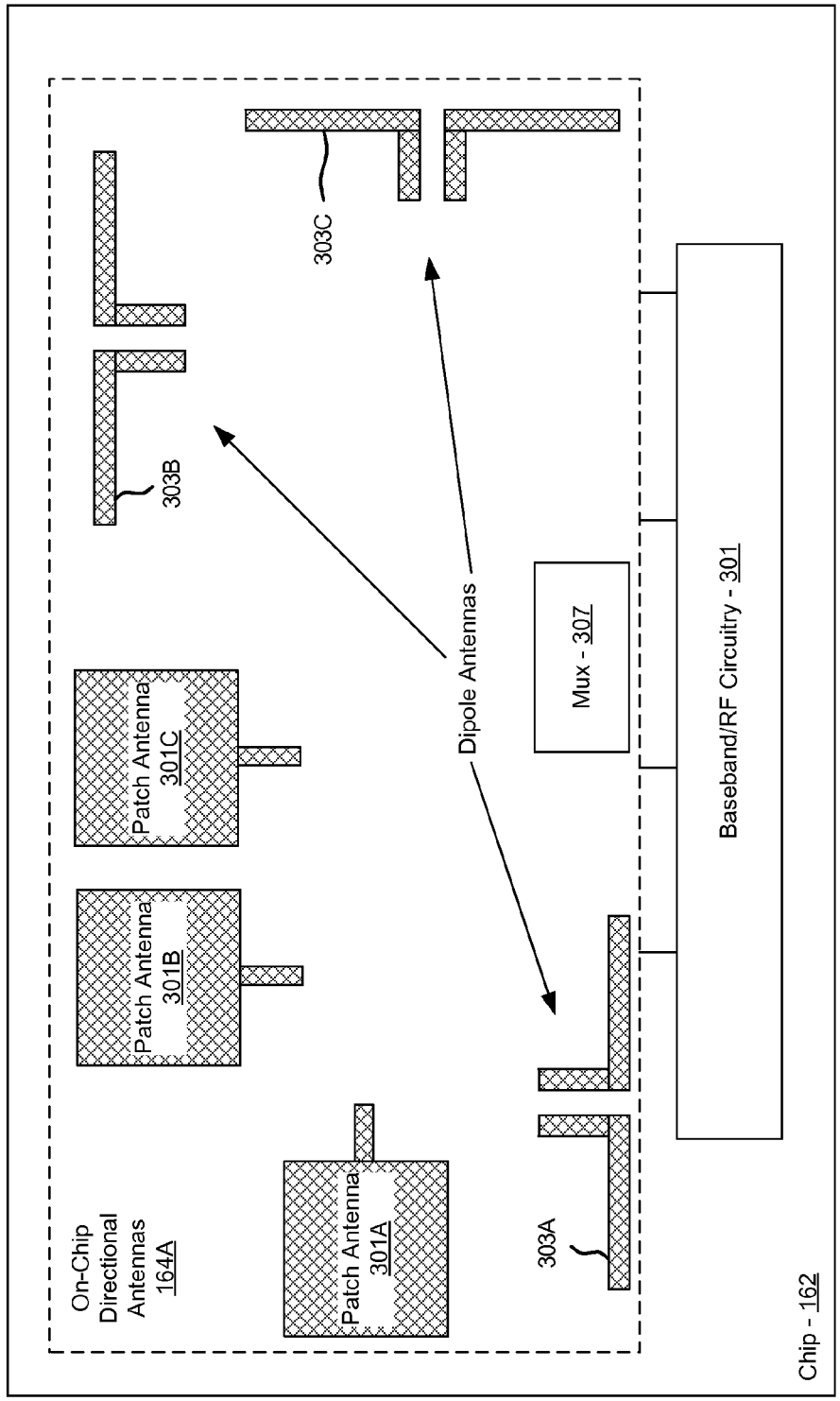
FIG. 3A is a diagram showing a top view of exemplary on-chip directional antennas, in accordance with an embodiment of the invention.

FIG. 3A is a diagram showing a top view of exemplary on-chip directional antennas, in accordance with an embodiment of the invention. Referring to FIG. 3, there is shown the chip 162 comprising the on-chip directional antennas 164A, a multiplexer (MUX) 307, and baseband/RF circuitry 301.

The on-chip directional antennas 164A may comprise patch antennas 301A-301C and dipole antennas 303A-303C, for example, but are not limited to these types of directional antennas. The patch antennas 301A-301C and dipole antennas 303A-303C may be selectable by switches, such as CMOS switches, for example, in the baseband/RF circuitry 301.

The baseband/RF circuitry 301 may comprise suitable, circuitry, interfaces, logic, and/or code that may be operable to process baseband and RF signals. Baseband signals may be down-converted received RF signals, or may be generated by input devices such as microphones, for example. The baseband/RF circuitry 301 may comprise the transceiver 152, the baseband processor 154, the processor 156, the CODEC 172, and the BT radio/processor 163, for example, described with respect to FIG. 1.

The MUX 307 may comprise suitable circuitry, logic, and/or code that may be operable to select one or more of the on-chip directional antennas 164A to the baseband/RF circuitry 301.

In operation, signals may be communicated to and from the chip 162 via the patch antennas 301A-301C and dipole antennas 303A-303C directed at other chips in the wireless device 150, such as the other chips 165, and/or to external devices such as the external device 257. The patch antennas 301A-301C and dipole antennas 303A-303C may be coupled to the baseband/RF circuitry via the MUX 307. The direction of the receiving chip and/or device in relation to the chip 162 may determine which of the patch antennas 301A-301C and/or the dipole antennas 303A-303C may be selected for communicating particular signals. In an embodiment of the invention, a plurality of antennas on a plurality of chips may be utilized to create a mesh network that may be operable to communicate wireless signals amongst the chips as well as to external devices. The wireless communication efficiency and signal quality may be optimized by utilizing directional antennas that result in the strongest signal, for example.

The antenna selected for communicating signals may be selected on the direction of the receiving chip and/or external device from the chip 162. For example, if a receiving chip is located to the left of the chip 162, the patch antenna 301A may be selected to communicate the signals. In addition, if a low output impedance, high output power PA is desired, a low impedance directional antenna may selected. Similarly, if a high gain, high input impedance LNA is desired, a high impedance directional antenna may be selected.

FIG. 3B is a diagram illustrating exemplary directional patch antennas, in accordance with an embodiment of the invention. Referring to FIG. 3B, there is shown patch antennas 300 and 310 comprising an array of pixel patches, such as the pixel patch 302, and switches, such as the switch 304. The number of pixel patches or switches per antenna is not limited by the number illustrated in FIG. 3B. The active area of the tunable antennas 300 and 310 may be adjusted by activating appropriate switches, as indicated by the switches which have been blackened, or closed, such as the switch 306, and open switches which are shown in FIG. 3B as white rectangles, such as the switch 304. In an embodiment of the invention, the patch antennas 300 and 310 may be integrated on or within the chip 162, described with respect to FIGS. 1, 2, and 3A.

In operation, the direction of transmission for the patch antennas 300 and 310 may be defined by the active patches, as indicated in FIG. 3B by closed switches, such as the switch 306. The active area may define a transmission radiation pattern with a maximum intensity in a desired direction as indicated by the large arrows from the top and bottom of patch antenna 300 and the sides of patch antenna 310, for example. The radiation patterns may be defined by a large variety of activated patch configurations and is not limited to those shown in FIG. 3B.

In an embodiment of the invention, the enabled portion of the patch antennas 300 and 310 may be configured for a desired direction of transmission. A plurality of patch antennas may be utilized on a plurality of chips to create a mesh network, such that wireless communication amongst the chips and with external devices may be optimized.

Figure 3C:
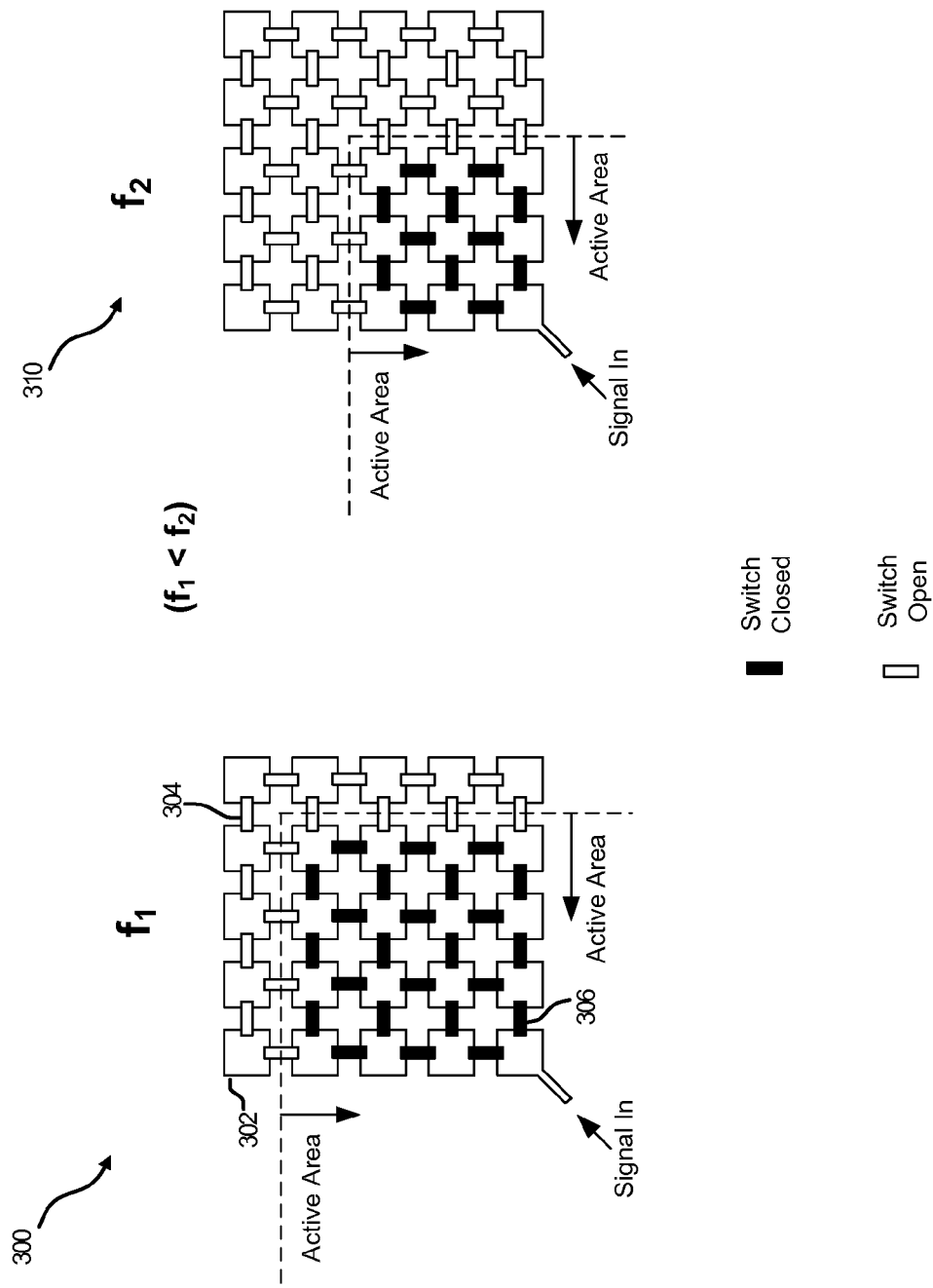
FIG. 3C is a block diagram illustrating exemplary patch antennas with configurable frequency, in accordance with an embodiment of the invention.

FIG. 3C is a block diagram illustrating exemplary patch antennas with configurable frequency, in accordance with an embodiment of the invention. Referring to FIG. 3C, there is shown patch antennas 300 and 310 each comprising an array of pixel patches, such as the pixel patch 302, and switches, such as the switch 304. The number of pixel patches or switches per antenna is not limited by the number illustrated in FIG. 3C. The active area of the patch antennas 300 and 310 may be adjusted by activating appropriate switches, as indicated by the switches which have been blackened (solid), or closed, such as the switch 306, and open switches which are shown in FIG. 3C as white rectangles, such as the switch 304. In an embodiment of the invention, the tunable antennas 300 and 310 may be integrated on or within the chip 162, described with respect to FIGS. 1, 2A, 2B, and 3A.

In operation, the frequency range of transmission for the patch antennas 300 and 310 may be defined by the active area, as indicated in FIG. 3C by the area enclosed by the open switches, such as the switch 304. If the active area is reduced as illustrated in the patch antenna 310, the frequency of transmission may be greater than for the larger active area patch antenna 300. In addition, the polarization of the transmitted field and the beam shape may be controlled by activating appropriate switches in the patch antennas 300 and/or 310, as described with respect to FIG. 3B. In an embodiment of the invention, both the frequency and direction of transmission may be configured for communicating signals between chips in the wireless device 150. In this manner, signals may be communicated at very high frequency within the wireless device 150 without drawbacks with wire traces between chips due to stray impedances, for example.

In an embodiment of the invention, the enabled portion of the patch antennas 300 and 310 may be configured for a desired direction of transmission. A plurality of patch antennas on a plurality of chips may be enabled to create a mesh network. By configuring the frequency of communication, the created mesh network may be enabled to communicate only with desired chips and/or external devices.

Figure 4:
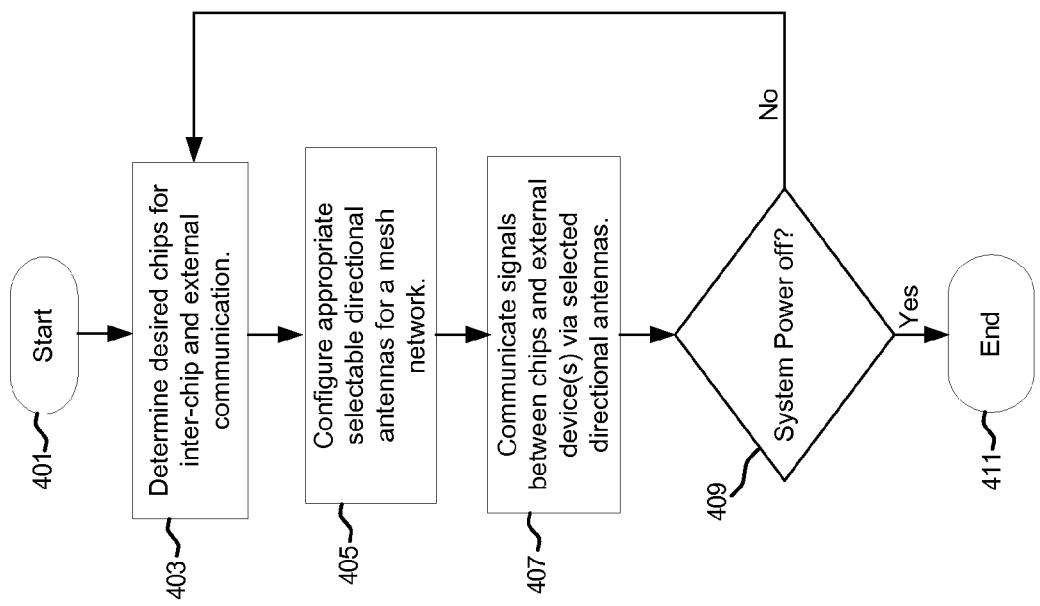
FIG. 4 is a block diagram illustrating exemplary steps for dynamic link control for chip to chip communication, in accordance with an embodiment of the invention.

FIG. 4 is a block diagram illustrating exemplary steps for chip to chip mesh networks, in accordance with an embodiment of the invention. Referring to FIG. 4, in step 403 after start step 401, the chips that are to be configured for a mesh network may be selected. In step 405, the appropriate directional antennas on the selected chips may be configured to communicate signals in the appropriate direction to form a mesh network enabling communication between the chips and/or external devices, followed by step 407, where the signals may be communicated between the chips and/or external devices and adjusted dynamically. If, in step 409, the wireless device 150 is to be powered down, the exemplary steps may proceed to end step 411, but if not the exemplary steps may return to step 403.

In an embodiment of the invention, a method and system are disclosed for chip to chip mesh networks. In this regard, wireless signals may be communicated via a mesh network 260 comprising a plurality of integrated directional antennas 164A/164B/301A-301C/303A-303C on the plurality of chips 162/165/255A-255G. Wireless signals may be communicated between the plurality of the chips 162/165/255A-255G and/or with devices external to the wireless device 150 via the mesh network 260. Beam-formed wireless signals may be communicated via the plurality of integrated directional antennas 164A/164B/301A-301C/303A-303C. The plurality of chips 162/165/255A-255G may be integrated on a single package 167 or on a plurality of packages, which may comprise one or more circuit boards. Wireless signals may be communicated with devices external to the single package 167 via the mesh network. The directional antennas 164A/164B/301A-301C/303A-303C may comprise patch antennas 301A-301C and/or dipole antennas 303A-303C.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for chip to chip mesh networks.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
in a package comprising a plurality of chips, wherein each of said plurality of chips comprises one or more transmitters and/or one or more receivers, and wherein each of said plurality of chips comprises one or more integrated directional antennas communicatively coupled to corresponding said one or more transmitters and/or to said one or more receivers in each of said plurality of chips:
configuring said one or more transmitters and/or said one or more receivers in each of said plurality of chips to establish a mesh network among said plurality of chips in said package using said one or more integrated directional antennas in each of said plurality of chips; and
communicating information among said plurality of chips in said package via said established mesh network.

2. The method according to claim 1, comprising communicating wireless signals between said plurality of chips via said established mesh network.

3. The method according to claim 1, comprising:
establishing one or more wireless communication links between one or more of said plurality of chips and another device that is external to said package; and
communicating wireless signals with said another device, which is external to said package, via said established mesh network.

4. The method according to claim 1, comprising communicating beam-formed wireless signals via said plurality of integrated directional antennas.

5. The method according to claim 1, wherein said package comprises a circuit board.

6. The method according to claim 1, comprising communicating wireless signals with devices external to said package via said established mesh network.

7. The method according to claim 1, wherein said directional antennas comprise patch antennas.

8. The method according to claim 1, wherein said directional antennas comprise dipole antennas.

9. A system for enabling communication, the system comprising:
a package comprising a plurality of chips, wherein each of said plurality of chips comprises one or more transmitters and/or one or more receivers, and wherein each of said plurality of chips one or more integrated directional antennas communicatively coupled to corresponding said one or more transmitters and/or to said one or more receivers in each of said plurality of chips, said package being operable to:
configure said one or more transmitters and/or said one or more receivers in each of said plurality of chips to establish a mesh network among said plurality of chips in said package using said one or more integrated directional antennas in each of said plurality of chips; and communicate information among said plurality of chips in said package via said established mesh network.

10. The system according to claim 9, wherein said package is operable to communicate wireless signals between said plurality of chips via said established mesh network.

11. The system according to claim 9, wherein said package is operable to establish one or more wireless communication links between one or more of said plurality of chips and another device that is external to said package;
and said package is operable to communicate wireless signals with said another device, which is external to said package, via said established mesh network.

12. The system according to claim 9, wherein said package is operable to communicate beam-formed wireless signals via said plurality of integrated directional antennas.

13. The system according to claim 9, wherein said package comprises a circuit board.

14. The system according to claim 9, wherein said package is operable to communicate wireless signals with devices external to said package via said wireless mesh network.

15. The system according to claim 9, wherein said directional antennas comprise patch antennas.

16. The system according to claim 9, wherein said directional antennas comprise dipole antennas.

\* \* \* \* \*